US008538492B2

(12) United States Patent
Sweeney et al.

(10) Patent No.: US 8,538,492 B2
(45) Date of Patent: Sep. 17, 2013

(54) SYSTEM AND METHOD FOR LOCALIZED NOISE CANCELLATION

(75) Inventors: Jeffrey M. Sweeney, Olathe, KS (US); Kelsyn D. Rooks, Sr., Overland Park, KS (US)

(73) Assignee: CenturyLink Intellectual Property LLC, Denver, CO (US)

( * ) Notice: Subject to any disclaimer, the term of this patent is extended or adjusted under 35 U.S.C. 154(b) by 827 days.

(21) Appl. No.: 11/897,762

(22) Filed: Aug. 31, 2007

(65) Prior Publication Data

US 2009/0060216 A1 Mar. 5, 2009

(51) Int. Cl.
*H04B 1/38* (2006.01)
*H04M 1/00* (2006.01)
*H03B 29/00* (2006.01)

(52) U.S. Cl.
USPC ........................ 455/570; 455/569.1; 381/71.1

(58) Field of Classification Search
USPC ........ 455/414.4–414.4, 445, 563, 569.1–570, 455/501, 67.13, 295–312; 370/268, 269, 370/286–292; 375/144, 148; 379/406.1–406.16; 381/71.1–71.14, 94.1, 381/73.1
See application file for complete search history.

(56) References Cited

U.S. PATENT DOCUMENTS 5,526,421 A * 6/1996 Berger et al. ............ 379/406.06
7,088,828 B1 * 8/2006 Bradford et al. ............. 381/71.1
8,300,801 B2 10/2012 Sweeney et al.
2002/0131581 A1 * 9/2002 Wittke et al. ............. 379/406.01
2003/0177006 A1 9/2003 Ichikawa et al.
2004/0052384 A1 3/2004 Ashley et al.
2004/0196984 A1 10/2004 Dame et al.
2004/0234080 A1 * 11/2004 Hernandez et al. ........ 381/71.11
2004/0246862 A1 12/2004 Cho et al.
2005/0027520 A1 2/2005 Mattila et al.
2005/0065778 A1 * 3/2005 Mastrianni et al. ........ 704/200.1
2006/0029212 A1 2/2006 Short et al.
2006/0045252 A1 * 3/2006 Gorti et al. ............... 379/201.02
2007/0165834 A1 7/2007 Redman et al.
2007/0291693 A1 * 12/2007 Schultz et al. ................ 370/331
2008/0118081 A1 * 5/2008 Chang .......................... 381/94.1
2009/0060216 A1 3/2009 Sweeney et al.
2009/0061882 A1 * 3/2009 Sweeney et al. .............. 455/445

OTHER PUBLICATIONS

Non-Final Office Action date mailed Jun. 21, 2010 in U.S. Appl. No. 11/897,906.
Response filed Sep. 21, 2010 for U.S. Appl. No. 11/897,906.
U.S. Appl. No. 11/897,906; Issue Notification dated May 16, 2012; 1 page.
U.S. Appl. No. 12/146,876; Notice of Allowance dated Jun. 22, 2012; 15 pages.
U.S. Appl. No. 12/146,876; Issue Notification dated Oct. 10, 2012; 1 page.

(Continued)

*Primary Examiner* — George Eng
*Assistant Examiner* — Marcus Hammonds
(74) *Attorney, Agent, or Firm* — Swanson & Bratschun, L.L.C.

(57) ABSTRACT

A system and method for localized noise cancellation. An audio signal is received from an environment in close proximity to a primary area. The audio signal is processed to generate an inverse signal of the audio signal. The inverse signal is broadcast within the primary area to destructively interfere with the audio signal. The inverse signal is configured to prevent the audio signal from being broadcast through a telephone conversation ongoing in the primary area.

18 Claims, 6 Drawing Sheets

(56) References Cited

OTHER PUBLICATIONS

U.S. Appl. No. 11/897,906; Supplemental Notice of Allowance dated Apr. 9, 2012; 3 pages.

U.S. Appl. No. 11/897,906; Notice of Allowance dated Feb. 17, 2012; 12 pages.

U.S. Appl. No. 12/146,876; Final Office Action dated Feb. 15, 2012; 14 pages.

* cited by examiner

SYSTEM AND METHOD FOR LOCALIZED NOISE CANCELLATION

BACKGROUND

In recent years, more and more individuals and employees work in close proximity. The close quarters of many office environments result from increasing expenses, lack of available office space, expanding business, and desired proximity of employees for purposes of efficiency. Cubicle- and open-office type settings are particularly prevalent because of the perceived efficient usage of space that allows a large number of people to work in close proximity to one another.

Although cubicles may be used to efficiently exploit available office space, cubicles lack privacy, allowing conversations, speech, and other information, to be easily overheard by others within the office. Hearing others' conversations or noise generated by others or their office equipment may be distracting or prohibitive while working, on the phone, or carrying on one's own conversation. Some users feel uncomfortable carrying on a conversation in public because they prefer privacy for sharing personal, business, or other information. As a result, working in a similar office environment may be frustrating and inconvenient.

SUMMARY

One embodiment includes a system and method for localized noise cancellation and is received from an environment in close proximity to a primary area. The audio signal is processed to generate an inverse signal of the audio signal. The inverse signal is broadcast within the primary area to destructively interfere with the audio signal. The inverse signal is configured to prevent the audio signal from being broadcast through a telephone conversation ongoing in the primary area.

Another embodiment includes a noise cancellation system. The noise cancellation system may include one or more microphones configured to receive an audio signal from areas in near proximity to a primary area. The noise cancellation system may also include a noise cancellation device including a signal generator in communication with the one or microphones configured to process the voice communication to determine a voice signal and the inverse of the voice signal. The noise cancellation system may also include one or more speakers in communication with the noise cancellation device configured to broadcast the inverse signal within the primary area as the audio signal is received for reducing the audio signal discernible by one or more users communicating using a telephone within the primary area.

Yet another embodiment includes a method for providing noise cancellation for a telephone conversation. An original signal entering the primary area of an open environment may be received and digitally approximated. An inverse signal to the original signal may be generated and the inverse signal is amplified. The inverse signal may broadcast to interfere with the original signal. The inverse signal may operate to cause the original signal to be less discernible by parties involved in a telephone conversation in the primary area.

BRIEF DESCRIPTION OF THE DRAWINGS

Illustrative embodiments of the present invention are described in detail below with reference to the attached drawing figures, which are incorporated by reference herein and wherein.

DETAILED DESCRIPTION OF THE DRAWINGS

Illustrative embodiments provide a system and method for localized noise cancellation. Speech and noise entering a primary area in the form of an audio signal may be processed. A response signal may be generated to interfere with the audio signal. In one embodiment, the response signal is an inverse signal or digital approximation of the audio signal that is 180 degrees out of phase. The audio signal and the inverse signal may destructively interfere to provide individuals within the primary area increased privacy and a quieter work environment to more efficiently perform various work tasks. In particular, the inverse signal may be used to ensure that voice communications using a telephonic device, such as a wireless telephone, standard telephone, or Voice over Internet Protocol (VoIP) telephone, may occur without excessive background noise.

Figure 1:
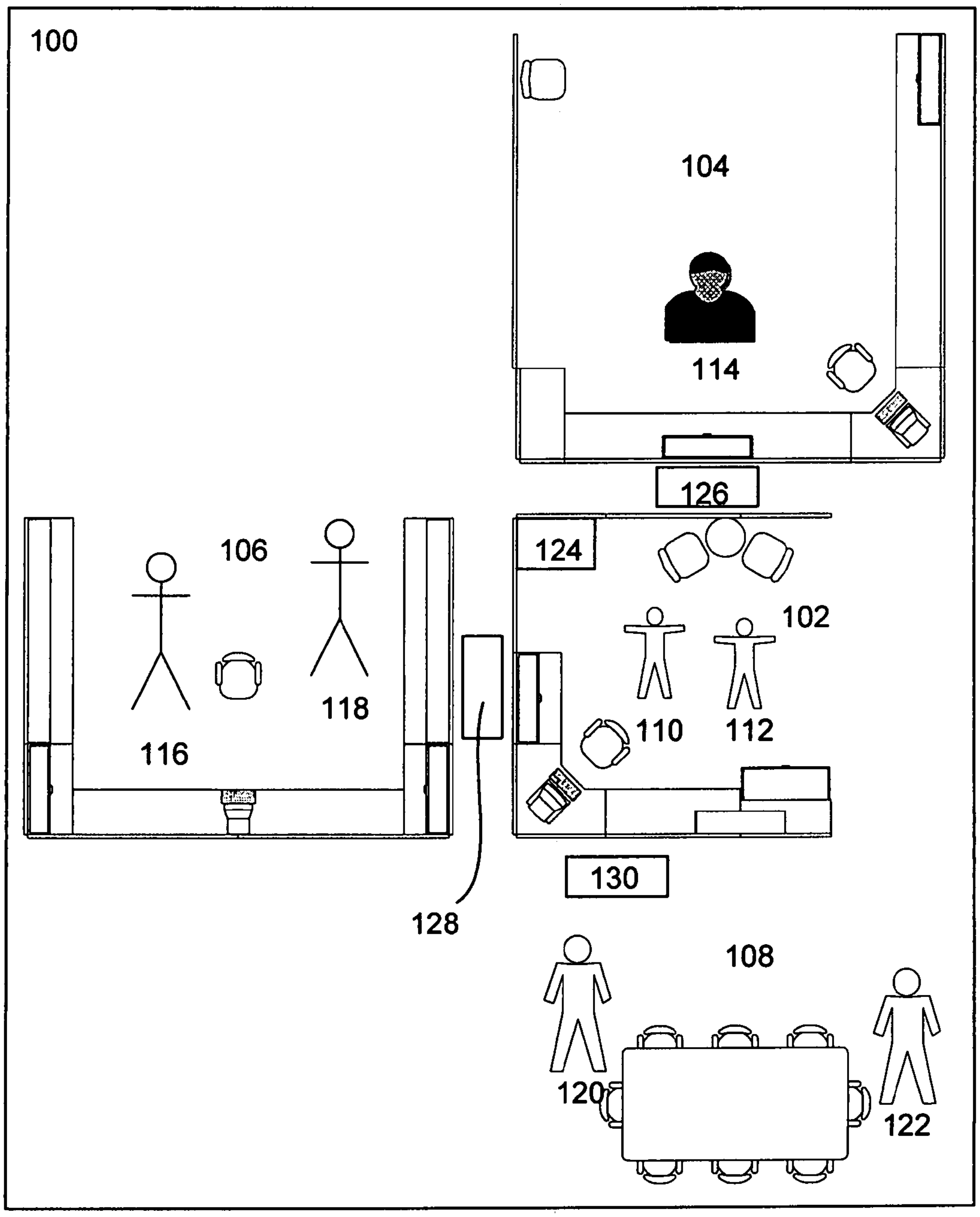
FIG. 1 is a pictorial representation of a conversation environment in accordance with an illustrative embodiment.

FIG. 1 is a pictorial representation of a conversation environment in accordance with an illustrative embodiment. The conversation environment 100 is any environment in which various sounds, noises, and speech are present and conversations may occur between any number of individuals. The conversation environment 100 may include a primary area 102, a telephone 103, a cubicle 104, a cubicle 106, a secondary area 108, individuals 110, 112, 114, 116, 118, 120, and 122, a noise cancellation device 124 and microphones 126, 128, and 130. As shown in FIG. 1, the conversation environment 100 may be a building, office space, or home. However, the conversation environment 100 may be any location, such as a restaurant, building, or other environment suitable for users to carry on a conversation. Illustrative embodiments may be particularly useful in an open office environment.

The primary area 102 is an area in which a noise or noise cancellation system may be utilized to enhance effective verbal or telephonic communications involving individuals 110 and 112. As shown, the primary area 102 may be surrounded or abutted by areas in which noises, sounds, speech, and conversations may be generated. For example, the individuals 114, 116, 118, 120, and 122 may be carrying on conversations amongst themselves, on the telephone, or may otherwise be generating sound that may constitute noise and/or speech. The noise and speech in the form of audio signals may propagate through the air from the cubicles 104 and 106, and the secondary area 108, into the primary area 102.

In one example, the speech and noise from each of these areas may interfere with the communications between the individuals 110 and 112. As a result, the individuals 110 and 112 may be unable to effectively concentrate, convey words and messages, or otherwise communicate with one another. Effective communication between the individuals 110 and 112 may be necessary in order to convey thoughts and ideas, perform business transactions, and maintain effective social communications.

In particular, the individuals 110 and 112 may be involved in a phone conference using the telephone 103 and they, as well as, the party(ies) with whom the individuals 110 and 112 are communicating may be unable to effectively communicate because of the incoming audio signals from the conversation environment. In one embodiment, the telephone 103 may be a cellular telephone. However, the telephone 103 may be any communications device suitable for carrying on a verbal conversation, including, but not limited to, a plain old telephone service (POTS) telephone, VoIP phone, base station and cordless handset, and conference phone.

In one embodiment, the individuals 110 and 112 may activate a noise cancellation device 124 for the primary area 102. For example, the individual 110 may turn on a power switch of the noise cancellation device 124 which may activate the microphones 126, 128, and 130. In another embodiment, the noise cancellation system may function at all times to ensure effective communications of one or more individuals within the primary area 102. The noise cancellation device 124 may also be automatically activated based on time of day, usage of the telephone 103, or motion sensors.

As shown, the primary area 102 is the only portion of the conversation environment 100 that includes a noise cancellation system. However, any number of noise cancellation systems or a single integrated noise cancellation system may be implemented to ensure effective communications within the primary area 102, the cubicles 104 and 106, and the secondary area 108 based on the needs of the individuals within the conversation environment 100.

Figure 2:
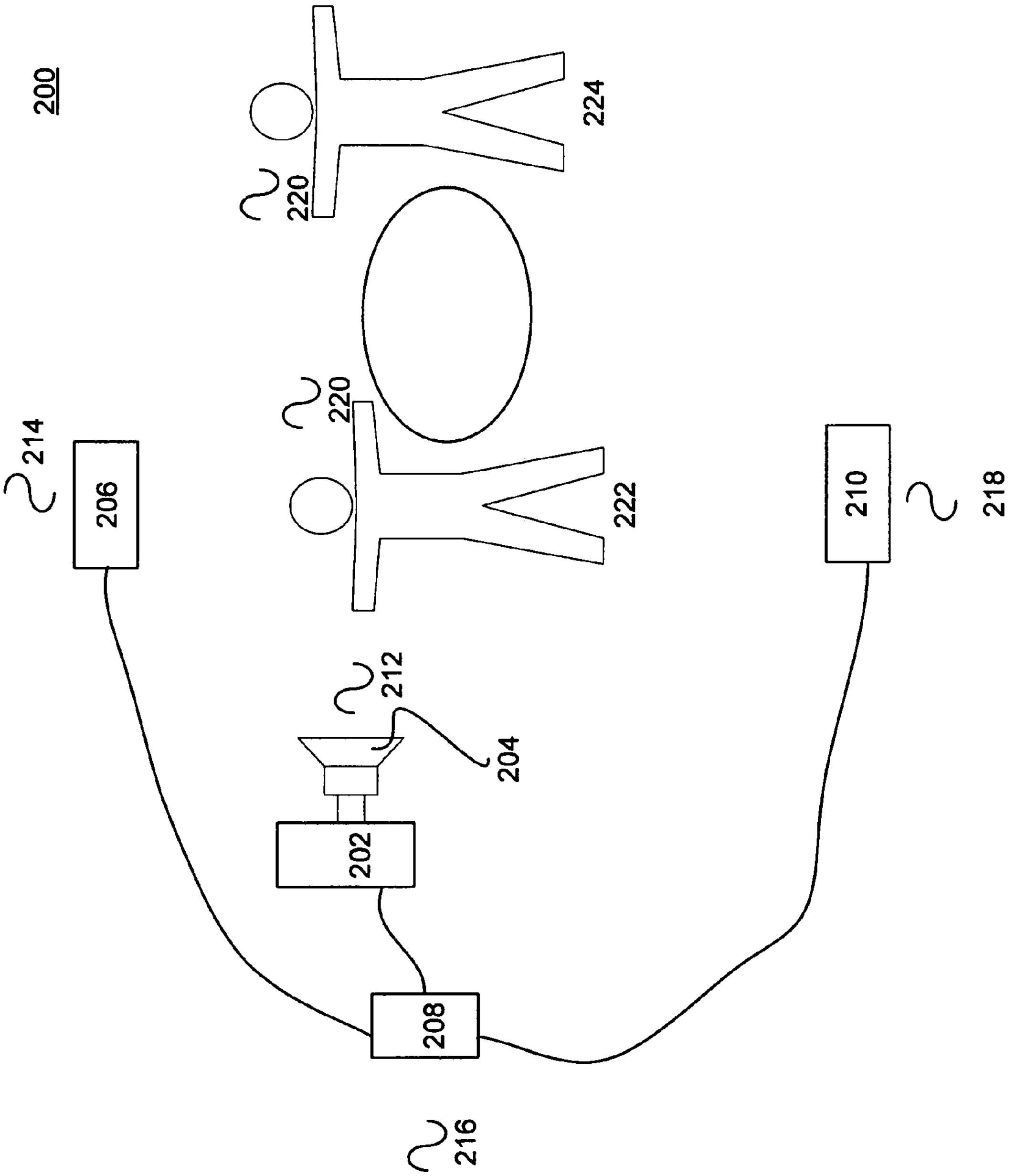
FIG. 2 is a pictorial representation of a noise cancellation environment in accordance with an illustrative embodiment.
Figure 4:
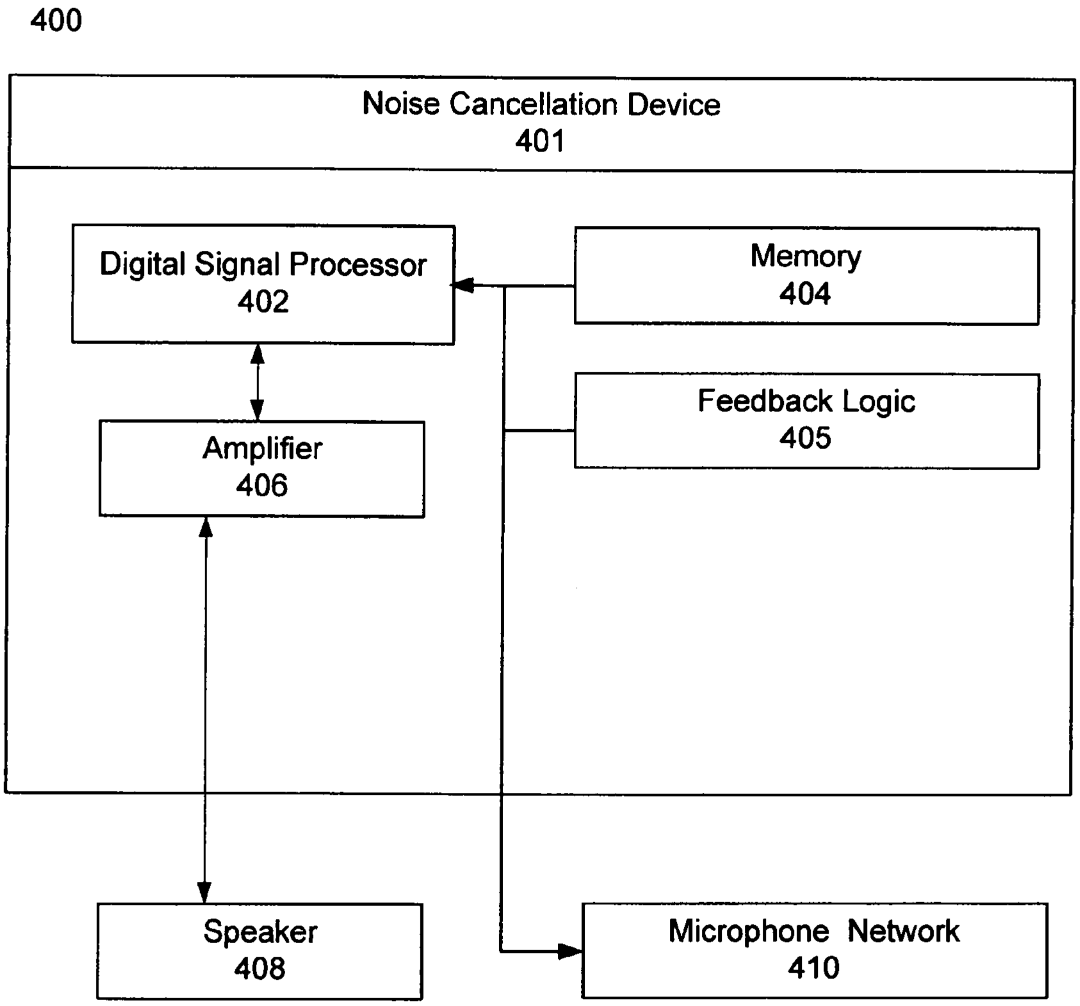
FIG. 4 is a block diagram of a noise cancellation system in accordance with an illustrative embodiment.

The noise cancellation system, and particularly the noise cancellation device 124, is further described in FIG. 2 and FIG. 4. The microphones 126, 128, and 130 are auditory input devices configured to receive sound, speech, and other noises propagating into the primary area 102 from the surrounding cubicles 104, 106, and the secondary area 108, and from other areas within the conversation environment 100. As shown, the primary area 102 may be a cubicle or office in which the individual 110 or individuals 110 and 112 work, live, or otherwise caryon business.

The microphones 126, 128, and 130 may be strategically located in order to receive the loudest or interfering speech, noise, or sounds from the surrounding areas. The microphones 126, 128, and 130 may be wired to the noise cancellation device 124. In another embodiment, the microphones 126, 128, and 130 may wirelessly communicate with the noise cancellation device 124. For example, the microphones 126, 128 and 130 may use a WiFi, Bluetooth, or WiMAX connection in order to send sounds, noises, and speech or the electronic waveforms, received from the cubicles 104 and 106 and the secondary area 108, to the noise cancellation device 124.

The noise cancellation system may be hard wired or portable. For example, the noise cancellation system, including the noise cancellation device 124 and microphones 126, 128, and 130, may be installed at the time the cubicles are assembled or at the time the office or conversation environment 100 is constructed. In another embodiment, the noise cancellation system may be a portable system suitable to be temporarily installed, or uninstalled as needed, in order to enhance communications within the primary area 102. Correspondingly, the noise cancellation system may be battery powered or may be hard wired into a power infrastructure of the conversation environment 100, a building, or another available power source.

The microphones 126, 128 and 130 may be directionally mounted in order to receive sounds, signals, and noises that are most likely to interfere with voice and telephone communications within the primary area 102. As shown, the microphones 126, 128 and 130 are directionally focused on the cubicle 104, the cubicle 106, and the secondary area 108 in from which sounds, noises, and conversations are most likely to enter the primary area.

The noise cancellation device 124 receives the audio input or audio signals from each of the microphones 126, 128, and 130 and processes the incoming signals individually or as a group in order to generate an inverse signal. The inverse signal may be a digital approximation of the audio signals received from each of the microphones 126, 128 and 130, with the exception that the inverse signal is out of phase with the combined signals received from the cubicles 104 and 106 and the secondary area 108. In one embodiment, the inverse signal is 180 degrees out of phase with the combined signals received so that when added through propagation the signals destructively interfere.

The noise cancellation device 124 may process the audio signals from the surrounding areas to generate the inverse signal based on the amplitude, frequency, phase, and other characteristics of the analog audio signals. The phase of the inverse signal may be tuned based on the feedback and analysis that may be performed by the noise cancellation device 124 to ensure destructive interference is occurring. The noise cancellation device 124 may then use an integrated multi-direction speaker to broadcast the inverse signal or inverse signals in the primary area 102 for the benefit of the individuals 110 and 112. As a result, the conversation and/or telephone communication involving the individuals 110 and 112 may be readily distinguishable and outside noise coming into the primary area 102 from the cubicles 104, and 106 and the secondary area 108 may be substantially decreased or cancelled out.

The noise cancellation device 124 may dynamically adjust the inverse signal that is broadcast based on changes in frequency, volume, other voice and noise characteristics of the audio signals received by the microphones 126, 128, and 130. The noise cancellation device 124 may be used to ensure that a party on the other end of a voice conversation with the individuals 110 and 112 through the telephone 103 is able to hear what the individuals 110 and 112 are communicating, regardless of the happenings in the conversation environment 100. In part, the cancelling waveform may be determined by the distance and configuration of the one or more microphones and the one or more speakers broadcasting the inverse signal. The inverse signal may be broadcast at a lower amplitude because the individuals 110 and 112 are farther away from the sounds coming from the cubicles 104 and 106 and the secondary area and the incoming sounds be further attenuated as it propagates and is heard by the individuals 110 and 112.

Additionally, the noise cancellation device 124 may compensate for humidity, air temperature, air pressure, viscosity, and other propagation and interference factors. In addition, the noise cancellation device 124 may compensate for glass walls, furniture, and other obstacles and mediums that may diffract sound waves in the conversation environment 100. As sound propagates through the air throughout a distance, the decibel levels decrease because of the inherent nature by which sound waves propagate through air molecules. The noise cancellation device 124 may compensate for distances between the microphones 126, 128, and 130, the noise cancellation device 124, and primary area 102. As mentioned, audio signals and sound waves lose energy as they propagate. As a result, the noise cancellation device 124 and corresponding speakers may broadcast the inverse signal based on the distance between the microphones 126, 128, and 130, speaker, and the other configuration of the primary area 102.

The noise cancellation device 124 may be connected to one or more speakers that may broadcast the inverse signal generated by the noise cancellation device. In one example, the microphones 126, 128, and 130 may also include a speaker for directionally broadcasting the inverse signal received from each of the cubicles 104, 106, and secondary area 108, respectively. The inverse signal as referred to herein may include any number of inverse signals generated and broadcast for the benefit of the primary area 102. The inverse signal(s) may be configured to individually or collectively destructively interfere with the audio signals that are propagated from the cubicles 104 and 106 and the secondary area 108 toward the primary area 102. As a result of the destructive interference, the individuals 110 and 112 may be better able to carry on a telephone conversation without extraneous audio signals.

In another embodiment, the audio signals generated within the primary area may be monitored in order to ensure the privacy of the individuals 110 and 112. For example, the microphones 126, 128, and 130 may receive signals from within the primary area 102. The microphones 126, 128, and 130 may also include speakers. The audio signals from within the primary area 102 may be processed from each of the microphones 126, 128, and 130 to generate multiple response signals that are then broadcast by the microphones 126, 128, and 130 to make the voice signals emanating from within the primary area 102 to the cubicles 104, 106, and secondary area 108 less intelligible, the result being that the individuals 114, 116, 118, 120, and 122 may be unable to distinguish speech generated within the primary area 102. The response signals broadcast may make the speech, words, and noises emanating from the primary area 102 unintelligible by distorting or otherwise cancelling the original audio signals.

In one embodiment, the response signal may be an inverse signal or a disruption signal. The response signal may be a digital approximation of the voice communications occurring in the primary area 102 with the only difference being that the response signal is out of phase with the voice communications signal. For example, the response signal may be an inverse signal 180 degrees out of phase with the voice communication signal.

The response signal may be approximated and generated by the noise cancellation device 124 to destructively interfere with voice communications, such as a phone conversation through the telephone 103. The response signal may be emitted as controlled by the noise cancellation device 124 to ensure that the voice communications spoken by the individuals 110 and 112 are substantially decreased or cancelled as they leave the primary area 102. The response signal may function as a cancellation signal intended to be of equal amplitude and opposite phase of the voice communications within the primary area 102.

In another embodiment, the response signal may be unable to completely destructively interfere with the voice communications occurring in the primary area 102. However, the response signal may make the words and meaning of the conversation unintelligible by distorting or otherwise modifying the original voice communications signal once combined. Once the voice communications signal 114 and distortion signal combine, the originally spoken words and sounds become distorted, muddled, and otherwise unintelligible. In one example, the distortion signal may be the verbal phone conversation of the individuals 110 and 112, played at a different pitch and with a slight time delay for making any signals overheard in the cubicles 104 and 106 and secondary area 108 seem like overlapping conversations. Pitch refers to the perceived fundamental frequency of a sound. In another embodiment, additional sounds, pre-recorded words, conversations, or noises, random tones, and frequent pitch changes may be integrated or played as part of the distortion signal. In another example, the response signal 116 may be an inverse signal generated at a lower power level with the purpose of convoluting or dampening the original communications signal 114.

The noise cancellation device 124 may be configured to destructively interfere with the sounds, voice signals, and noises generated outside or within the primary area based on a user selection or preference. In one embodiment, the noise cancellation system, and particularly the noise cancellation device 124, may broadcast inverse signals within the primary area 102 to destructively interfere with audio signals entering the primary area 102 and concurrently generate inverse signals that are broadcast to cubicle 104, cubicle 106, and secondary area 108 to destructively interfere with the voice signals that are generated by the individuals 110 and 112 from within the primary area 102. As a result, the individuals 110, 112, 114, 116, 118, 120, and 122 may all more effectively communicate within their respective areas, knowing that the noise cancellation system may provide them with enhanced privacy, security, and a more personal environment fostering better communications.

In another embodiment, the noise cancellation device 124 may be an integrated portion of the telephone 103. For example, the microphone, speaker, and noise cancellation features may be part of the telephone 103. The speaker for receiving incoming signals may be part of a cordless handset and the signal generator, noise cancellation functionality, and speaker may be part of the cordless base station. The telephone 103 may also be a cellular telephone, conference phone, or other telephone device that may perform noise cancellation or portions of the localized noised cancellation features herein described.

FIG. 2 is a pictorial representation of a noise cancellation environment in accordance with an illustrative embodiment. FIG. 2 includes a noise cancellation environment 200 which is a particular implementation of the primary area 102 of FIG. 1. The noise cancellation environment 200 may include elements of a noise cancellation system, including a noise cancellation device 202, a speaker 204, microphones 206, 208, and 210 and telephone 211. The noise cancellation environment 200 may further include an inverse signal 212, signals 214, 216, and 218, voice communication signal 220, and users 222 and 224.

Signals 214, 216, and 218 represent the audio signals or audio waves received by the microphones 206, 208, and 210 from the surrounding areas. The microphones 206, 208, and 210 may collectively communicate with the noise cancellation device 202 through a wired or wireless connection. In another embodiment, the speaker 204 and microphones 206, 208, and 210 may individually communicate with the noise cancellation device 202 through a wired or wireless connection.

The noise cancellation device 202 may similarly process the signals 214, 216, and 218 individually or as a group. In one embodiment, the signals 214, 216, and 218 are individually processed by the noise cancellation device 202 in order to generate individual inverse wave forms as received from each of the microphones 206, 208, and 210. The generation of the inverse signal is further described in FIG. 6.

The speaker 204 may be an audio output device that is configured to output the inverse signal 212. The speaker 204 may be integrated with the cancellation device 202 or may be networked to the noise cancellation device 202 through a wired or wireless connection. In one embodiment, the noise cancellation environment 200 includes a single speaker 204. In other embodiments, the noise cancellation environment 200 may include a number of speakers strategically located to broadcast the inverse signal 212 for the benefit of the users 222 and 224.

As previously described, the microphones 206, 208, and 210 may incorporate the features of the speaker 204 in order to broadcast the inverse signal 212 that destructively interferes with each of the signals 214, 216, and 218. In another embodiment, the speaker 204 may output the inverse signal 212 in multiple directions. For example, the speaker 204 may be optimally positioned or directionally focused to broadcast the inverse signal 212 to interfere with the signals 214, 216, and 218 in order to maximize destructive interference or distortion of the signals 214, 216, and 218.

The noise cancellation device 202, and its respective noise cancellation elements, ensure that the voice communication signal 220 exchanged between the users 222 and 224 is not disrupted, overpowered, or convoluted by the signals 214, 216, and 218. In one embodiment, the voice communication signal 220 may be part of a conversation between the individuals 222 and 224, as well as one or more individuals communicating through the telephone 211. Many individuals have experienced frustration from trying to concentrate on the speech of another individual during a phone conversation when multiple conversations, background noises, other sounds are interfering with the user's hearing. For example, it may be difficult to concentrate on a single conversation when multiple conversations, in the form of signals 214, 216, and 218, are propagating into the voice cancellation environment 200. The inverse signal 212 destructively interferes with the signals 214, 216, and 218 to enhance communications between the users 222 and 224 and verbal conversations through the telephone 211.

For example, the users 222 and 224 may be carrying on a phone conversation or conference call with another individual, and by activating the noise cancellation device 202, the signals 214, 216, and 218 may not be communicated through the communications link to the other party. As a result, even though the users 222 and 224 may be surrounded by any number of individuals, offices, cubicles, or sounds, the voice communication signal 220 may be effectively communicated without substantial interference.

In one embodiment, the telephone 211 is connected to the noise cancellation device 208. A dialed or received call activates the noise cancellation device 208. Similarly the noise cancellation device may use adaptive filtering to ensure that the inverse signal 212 does not feed back into the telephone.

Figure 3:
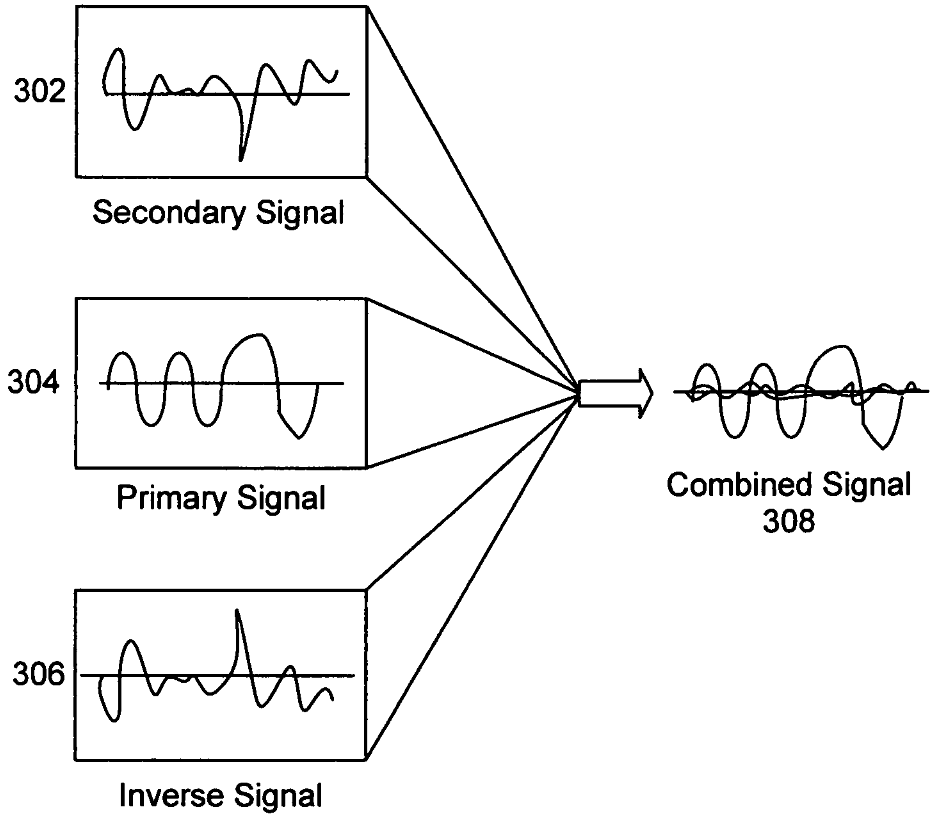
FIG. 3 illustrates noise cancellation signals in accordance with an illustrative embodiment.

FIG. 3 illustrates noise cancellation signals in accordance with an illustrative embodiment. FIG. 3 includes a number of signals that may be present in the conversation environment 100 of FIG. 1. The various signals are electronically represented by a wave form as a visual aid to further describe the illustrative embodiments. FIG. 3 includes a secondary signal 302, a primary signal 304, an inverse signal 306, and a combined signal 308. The processing of the signals of FIG. 3 are further described in FIG. 6.

The secondary signal 302 may be a particular implementation of signals 214, 216 and 218 received from the microphones 206, 208, and 210, all of FIG. 2. In other words, the secondary signal 302 may be the audio signal(s) most likely to interfere with telephone and voice communications within a primary area. The secondary signal 302 may represent the speech, noises, and sounds from individuals, equipment or machines, or background noise that propagates into the primary area. As previously mentioned, the secondary signal may be a single signal or a combination of signals. The secondary signal 302 may vary in frequency and amplitude based on the loudness and types of sounds received by one or more microphones.

The primary signal 304 is a particular implementation of the voice communication signal 220 of FIG. 2. In one embodiment, the primary signal 304 may be the signal that multiple users desire to effectively communicate with each other in person or through a communications-enabled device.

The inverse signal 306 may be the signal that is processed and generated by a noise cancellation device in order to destructively interfere with the secondary signal 302. In one example, the inverse signal is an approximation of the secondary signal that is 180 degrees out of phase with the secondary signal 302. The inverse signal 306 may be an approximation based on the limitations and processing abilities of the noise cancellation device and signal processing elements. In another example, the inverse signal 306 may be a distortion signal as previously described The combined signal 308 may be the combination of the secondary signal 302, the primary signal 304, and the inverse signal 306. As shown by the combined signal 308, the secondary signal 302, and the inverse signal 306 have destructively interfered to effectively cancel each other out. The combined signal 308 is distinguished by the similarities to the primary signal 304. As a result, the combined signal, as processed by the human auditory system and brain, nearly approximates the primary signal as originally spoken by one or more users.

The extraneous sounds, noises, and speech in the form of the secondary signal 302 may be minimized or cancelled by the inverse signal 306 so that the human auditory system is able to distinguish only the speech, sounds, and noises conveyed by the primary signal 304 from the combined signal 308.

FIG. 4 is a block diagram of a noise cancellation system in accordance with an illustrative embodiment. The noise cancellation system 400 may be a particular implementation of the noise cancellation device 401 and interconnected elements of FIG. 2. The noise cancellation device 401 may include various elements including a digital signal processor 402, a memory 404, feedback logic 405, an amplifier 406, a speaker 408, and a microphone network 410. The speaker 408 and the microphone network 410 may be integrated with the noise cancellation device 401 or may be externally connected as shown in the embodiment of FIG. 4.

The noise cancellation device 401 may be a combination of hardware and software elements which may be implemented using various structures and implementations. The example shown in FIG. 4 is given for illustration purposes only, and not as a limitation of required elements. The noise cancellation device 401 may be enabled to provide localized noise and voice cancellation in order to enhance communications and privacy.

The digital signal processor 402 may be a signal processing device, noise cancellation logic, chipset, a signal generator, or an amplifier. The digital signal processor 402 may also be any processing device suitable for processing speech, sound, noise, and communications signals. In another embodiment, the digital signal processor may include other hardware and/or software implementing conversation privacy logic configured to generate the inverse signal broadcast from the speaker 408 of the noise cancellation device 400 or an externally-linked speaker.

In particular, the digital signal processor 402 may include various pre-amplifiers, power amplifiers, digital-to-analog converters, and audio CODECs to dynamically generate a response signal to distort or destructively interfere with the specified voice conversation. The digital signal processor 402 may alternatively be a digital logic or a noise cancellation software program executed by a standard processor to analyze the incoming voice communications in order to generate the response signal. In particular, the digital signal processor 402 may receive audio input or signals from the microphone network.

The microphone network 410 may be one or more audio input devices configured to receive the audio input, voice communications, and noises from other areas or from an environment surrounding users of the noise cancellation device 401. The microphone network 410 electronically communicates the voice communication signal to the digital signal processor 402. The digital signal processor 402 analyzes the voice communications signal in order to generate the inverse signal, such as inverse signal 306 of FIG. 3.

The noise cancellation device 401 may include the feedback logic 405, circuitry, or software suitable for ensuring that the inverse signal broadcast from the speaker 408 does not feed back into an interconnected telephone or the noise cancellation device 401 through the microphone network 410. As a result, the user is able to clearly carry on a conversation even with substantial noises and sounds from the user's surrounding environment. The feedback logic 512 may include an adaptive or dynamic filter for filtering the inverse or response signal that feeds back through the microphone network 410 when broadcast through the speaker 408.

The amplifier 406 may be used to amplify the inverse signal for output by the speaker 408. Since each person naturally speaks at a different volume level, the amplifier 406 amplifies the inverse signal as needed to destructively interfere with the original voice communication signal. In one embodiment, a user may be able to set a privacy level for the noise cancellation device 401. In some instances, the decision to select a specified privacy level may be based on the power output or signal amplitude required for the inverse signal broadcast from the speaker to destructively interfere with the original signals detected by the microphone network 410. In the case of a batterypowered noise cancellation device, to generate an inverse signal that is most likely to render the voice communications completely unintelligible may require substantial power through the speaker 408 which may quickly drain a battery of the noise cancellation device 401. As a result, the user may select a privacy level based on the required level of privacy and communications effectiveness balanced against the current battery or power availability.

The memory 404 may be a static or dynamic storage medium, such as static random access memory, flash memory, or dynamic random access memory. However, the memory may be a hard disk read-only memory, or other suitable form or combination of volatile or nonvolatile memory. The memory 404 may store user preferences, data, information, applications, and instructions for execution by the digital signal processor 402 to implement the noise cancellation functions of the noise cancellation device 401. The user may establish noise cancellation preferences for dialed or received calls for various contacts, area codes, or phone numbers. For example, one or more phone numbers associated with the user's supervisor may be assigned the highest privacy level for ensuring that the conversation between the parties is as private as possible. As a result, the noise cancellation device 401 may be automatically activated and broadcast an inverse signal at full power when the user's supervisor is on the telephone.

The noise cancellation device 401 may further include a user interface and display which may include buttons, knobs, a touch screen, and other interactive elements to allow the user to enter and receive information. For example, the user may use an interface to set user preferences during times when the noise cancellation device 401 is automatically activated. The user preferences may also include power settings, microphone and speaker configuration, activation controls, and other features.

The noise cancellation device 401 may also automatically determine configuration information, including distances between the speaker 408, microphone network 410, and noise cancellation device 401. The configuration is important because, depending on how the elements connected to the noise cancellation device 401 are configured, the amplifier 406 may need to increase or decrease the signal strength of the inverse signal to effectively destructively interfere with audio signals entering a primary area. In one embodiment, the noise cancellation device 401 may use wireless communication to effectively determine the distance from the speaker 408, microphone network 410, and a central point of the primary area. In another embodiment, a user may be required to manually enter information about the configuration of the noise cancellation system, including distance and direction, of the elements in FIG. 4.

The noise cancellation device 401 may be integrated with a personal computer or other computing device or audio system to perform the noise cancellation features herein described. For example, the noise cancellation device 401 may be an integrated part of a speaker telephone. The noise cancellation device 401 may also be a software program within a personal computer that controls noise cancellation for one or more designated areas. By activating the noise cancellation application, the user may ensure privacy and effective communications within an area.

In another embodiment, the noise cancellation device 401 may encompass a number of noise cancellation devices that are integrated into a single system. The noise cancellation device 401 may be a server that operates multiple other noise cancellation devices or noise cancellation clients including a VoIP telephone. For example, each area within an environment may include a noise cancellation device that is networked to the noise cancellation system. Each microphone network and speaker network may input information to the central noise cancellation system using a matrix, graph, signal chart, algorithm, or programs to effectively measure the audio signals received inside and outside of the area and distances and broadcast the inverse signal at power levels required to effectively limit the sounds entering the area through destructive interference. The noise cancellation system may use various feedback systems to ensure that the inverse signals broadcast from the multiple microphones do not feed back into one or more of the speaker networks. In one embodiment, the user may activate the noise cancellation device 401 by speaking a key word, pressing a button, or using a remote or wireless device.

Figure 5:
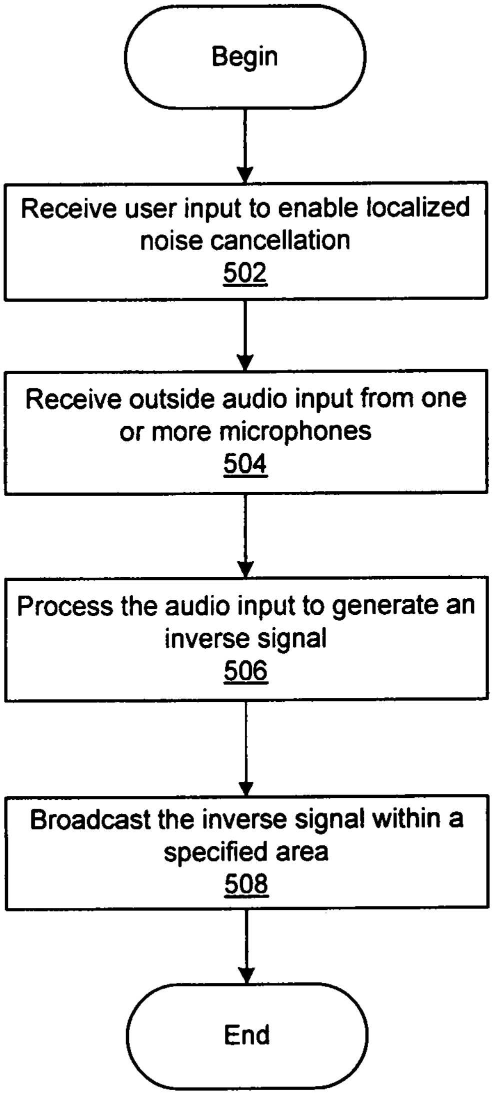
FIG. 5 is a flowchart of a process for noise cancellation in accordance with an illustrative embodiment.

FIG. 5 is a flowchart of a noise cancellation process in accordance with an illustrative embodiment. The process of FIG. 5 may be implemented by a noise cancellation system. In particular, a noise cancellation device may implement the features, functions, and steps described by FIG. 5.

The process may begin by receiving user input to enable localized noise cancellation (step 502). The user input may be a user selection or activation of the noise cancellation device. For example, the user may select a switch or use a computing device in communication with the noise cancellation device to activate the localized voice cancellation. In one example, the user may select an icon on the user's desktop to enable localized voice cancellation.

Next, the noise cancellation device receives outside audio input from one or more microphones (step 504). The audio input may be received through a wired or a wireless connection. The audio input may include separate inputs from each microphone, or a single, combined audio input from a network of microphones.

The noise cancellation device processes the audio input to generate an inverse signal (step 506). The inverse signal may be an approximation of the audio input, in particular, the inverse signal may be 180 degrees out of phase with the audio input in order to ensure destructive interference as the audio input and inverse signal propagate through the air.

Next, the noise cancellation device broadcasts the inverse signal within a specified area (step 508). The signal may be broadcast in step 508 by electronically communicating the inverse signal with one or more speakers, which may convert the inverse signal into an audio signal in order to destructively interfere with the audio input as received in step 504. The specified area may be the primary area in which one or more users desire to communicate without outside interference or other objectionable noises.

Figure 6:
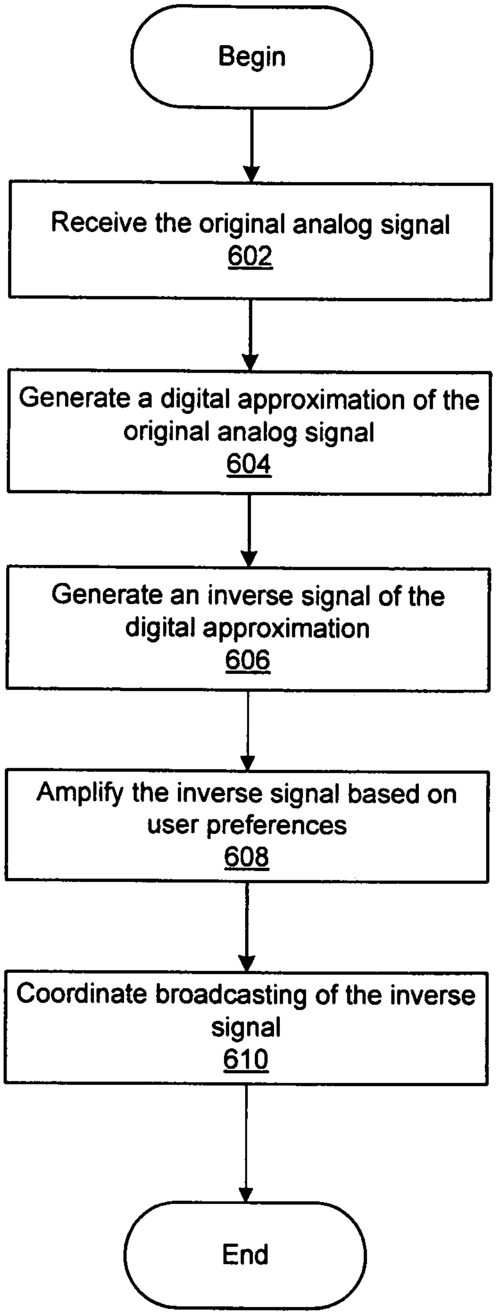
FIG. 6 is a flowchart of a process for generating an inverse signal in accordance with an illustrative embodiment.

FIG. 6 is a flowchart of a process for generating an inverse signal in accordance with an illustrative embodiment. The process of FIG. 6 may be implemented by a signal generator, digital signal processor, digital logic, amplifier, analog computing device, or signal processing application of a noise cancellation system or device. Alternatively, the process of FIG. 7 may be wholly or partly performed by a stand-alone speaker integrating the features of a noise cancellation system in communication with the wireless device.

The determination to perform the process of FIG. 6 may be performed based on user input. In one embodiment, the localized noise cancellation system may be constantly activated, activated during work hours, or motion activated. For example, once a call is made or received, or a visitor, guest, or associate, comes into the primary area, the noise cancellation system may be manually or automatically activated.

The process may begin by receiving the original analog signal (step 602). The original analog signal may be the speech, noise, and sounds entering a primary area from surrounding areas. The original analog signal may be the signal the user would like to prevent himself/herself and other parties within the primary area or communicating over the phone in the primary area from overhearing. The original analog signal may be a single signal or multiple signals from a microphone network. Likewise, each of the one or more received original analog signals may be processed as described by FIG. 6 individually or separately.

The signal generator generates a digital approximation of the original analog signal (step 604). The signal generator may use any number of pre-amplifiers, buffers, or analog-to-digital converters to generate the digital approximation. Next, the signal generator generates an inverse signal of the digital approximation (step 606). The inverse signal may be the anti-original signal. The original analog signal or noises coming into the primary area consists of a spectrum of frequencies and different amplitudes. In order to effectively cancel out each waveform, the signal generator may separately filter each frequency, determine its frequency, and create the same frequency and amplitude at 180 degrees out of phase.

Next, the signal generator amplifies the inverse signal based on user preferences (step 608). The user preferences may specify the power or amplitude level of the inverse signal. For example, the user may have selected to attempt complete destructive interference with the original analog signal or just dampening of the original signal. The signal may also be generated in step 608 based on available battery power if the noise cancellation device is battery operated. During step 608, the signal generator may also convert the inverse signal to an analog equivalent that may be broadcast through the available speaker or communicating device.

Next, the signal generator coordinates broadcasting of the inverse signal (step 610). The broadcasting may be performed by one or more speakers in communication with the noise cancellation device, an integrated speaker, or other linked device. Because the original analog signal received in step 602 may include so many frequencies and fractions of frequencies, the signal generator may selectively approximate a narrow band of frequencies of the original analog signal for generating the inverse signal.

The previous detailed description is of a small number of embodiments for implementing the invention and is not intended to be limiting in scope. The following claims set forth a number of the embodiments of the invention disclosed with greater particularity.

What is claimed:

1. A method for localized noise cancellation, the method comprising:

receiving an audio signal associated with a telephone conversation over a telephone from an environment in close proximity to a primary area, wherein the telephone is located in the environment in close proximity to the primary area, one or more users are located within the primary area, the audio signal being received by a microphone network affixedly positioned about a periphery of the primary area, the microphone network comprising a plurality of microphones fixedly installed in a stationary structure defining the periphery of the primary area, the stationary structure further defining a boundary between the primary area and the environment in close proximity to the primary area, wherein the telephone is separate from the stationary structure;

processing, with a noise cancelling device in communication with the telephone, the microphone network, and one or more speakers fixedly installed in the stationary structure defining the periphery of the primary area and defining the boundary between the primary area and the environment in close proximity to the primary area, the audio signal to generate an inverse signal of the audio signal, wherein the noise cancelling device becomes activated and generates the inverse of the audio signal associated with the telephone conversation, in response to the telephone making or receiving a call; and broadcasting, with one or more of the one or more speakers, the inverse signal within the primary area to destructively interfere with the audio signal associated with the telephone conversation, the inverse signal being configured to reduce or eliminate the audio signal discernible to the one or more users within the primary area; and automatically activating the noise cancellation device to perform the broadcasting based on user preferences that include a time of day and caller information associated with the telephone conversation.

2. The method according to claim 1, wherein the microphone network includes one or more microphones separately positioned about a periphery of the primary area.

3. The method according to claim 1, wherein the audio signal is a plurality of audio signals received from the microphone network, the microphone network including a plurality of microphones directionally positioned about the periphery of the primary area to receive the plurality of audio signals entering the primary area.

4. The method according to claim 1, wherein the inverse signal combines with the audio signal during propagation to prevent the audio signal from being communicated within a telephone conversation occurring within the primary area.

5. The method according to claim 1, further comprising:

receiving user preferences regarding operation of the noise cancellation device;

receiving user input to activate the noise cancellation device to broadcast the inverse signal to ensure better communications within the primary area, the broadcasting is enabled to be automatically initiated in response to a user selection to perform call privacy or user preferences, and wherein the primary area is part of an open office environment.

6. The method according to claim 1, further comprising:

amplifying the inverse signal to match an amplitude of the audio signal, wherein the inverse signal is a digital approximation of the audio signal and 180 degrees out of phase with the audio signal.

7. The method according to claim 1, wherein the microphone network and the one or more speakers are hard wired to the noise cancellation device performing the processing, and wherein the inverse signal is proportional to distances between bystanders in the environment and the one or more speakers.

8. The method according to claim 1, further comprising:

receiving a voice signal from the one or more users in the primary area;

processing the voice signal to generate a secondary inverse signal; and broadcasting the secondary inverse signal through one or more speakers positioned about the periphery of the primary area and directed outside the primary area to destructively interfere with the voice signal to prevent individuals outside of the primary area from discerning the voice signal.

9. The method according to claim 8, wherein the secondary inverse signal is a distortion signal, and wherein the distortion signal combines with the voice signal to render the voice signal unintelligible to the individuals outside of the primary area.

10. The method according to claim 1, wherein the receiving, processing, and broadcasting are performed by a wired telephone including one of a conference telephone, a plain old telephone service telephone, or a voice over Internet Protocol telephone.

11. A noise cancellation system, the system comprising:

a microphone network affixedly positioned about a periphery of a primary area configured to receive an audio signal associated with a telephone conversation over a telephone from areas in near proximity to the primary area, wherein the telephone is located in one of the areas in near proximity to the primary area, one or more users are located within the primary area, the microphone network comprising one or more microphones fixedly installed in a stationary structure defining the periphery of the primary area, the stationary structure further defining a boundary between the primary area and the areas in near proximity to the primary area, wherein the telephone is separate from the stationary structure;

a noise cancellation device including a signal generator, in communication with the telephone and the microphone network, configured to process the audio signal to generate an inverse of the audio signal, wherein the noise cancellation device automatically becomes activated and generates the inverse of the audio signal associated with the telephone conversation, in response to the telephone making or receiving a call and based on user preferences, the user preferences including a time of day and caller information associated with the telephone conversation; and one or more speakers, fixedly installed in the stationary structure defining the periphery of the primary area and defining the boundary between the primary area and the areas in near proximity to the primary area, and in communication with the noise cancellation device, the one or more speakers being configured to broadcast the inverse signal within the primary area as the audio signal is received for reducing the audio signal discernible by the one or more users within the primary area.

12. The noise cancellation system according to claim 11, wherein the noise cancellation device is a hard wired telephone or a personal computer, wherein the noise cancellation device includes an amplifier configured to amplify the inverse signal to destructively interfere with the voice communication at a level specified by the one or more users when broadcast by the one or more speakers.

13. The noise cancellation system according to claim 11, wherein the one or more microphones receive a voice signal from the one or more users carrying on a telephone conversation in the primary area, the noise cancellation device processes the voice signal to generate a secondary inverse signal, and the one or more speakers broadcast the secondary inverse signal to destructively interfere with the voice signal to prevent individuals outside of the primary area from discerning the voice signal.

14. The noise cancellation system according to claim 11, further comprising:

a plurality of one or more microphones, a plurality of noise cancellation devices, and a plurality of one or more speakers for performing localized noise cancellation for a plurality of areas within an environment.

15. The noise cancellation system according to claim 13, wherein a signal strength of the inverse signal and a signal strength of the secondary inverse signal is determined based on the distances between the primary area, the noise cancellation device, the one or more microphones, and the one or more speakers.

16. A method for providing noise cancellation for a telephone conversation comprising:

receiving, from a microphone network, an original signal entering a primary area of an open environment, wherein the original signal comprises an audio signal associated with a first telephone conversation over a telephone located in close proximity to the primary area, the microphone network comprising one or more microphones positioned about a periphery of the primary area and fixedly installed in a stationary structure defining the periphery of the primary area, the stationary structure further defining a boundary between the primary area and the telephone located in close proximity to the primary area, wherein the telephone is separate from the stationary structure, wherein the primary area accommodates one or more users;

digitally approximating the original signal;

generating an inverse signal to the original signal utilizing a noise cancellation device, wherein the noise cancellation device is connected with the telephone, and wherein the noise cancellation device becomes activated and generates the inverse of the original signal associated with the telephone conversation, in response to the telephone making or receiving a call;

amplifying the inverse signal; and automatically broadcasting the inverse signal from one or more speakers fixedly installed in the stationary structure defining the periphery of the primary area and defining the boundary between the primary area and the telephone in close proximity to the primary area, to destructively interfere with the original signal associated with the first telephone conversation, the inverse signal operative to cause the original signal to be less discernible by one or more parties involved in a second telephone conversation in the primary area, based on user preferences that include a time of day and caller information associated with the telephone conversation.

17. The method of claim 16, further comprising:

filtering the inverse signal from being communicated in the second telephone conversation.

18. The method of claim 16, further comprising:

receiving a voice signal representing the second telephone conversation from the one or more parties in the primary area;

processing the voice signal to generate a secondary inverse signal; and broadcasting the secondary inverse signal outside the periphery of the primary area to destructively interfere with the voice signal to prevent individuals outside of the primary area from discerning the voice signal and corresponding second telephone conversation.

* * * * *